United States Patent [19]

Tsai

[11] Patent Number: 6,127,807

[45] Date of Patent: Oct. 3, 2000

[54] METHOD FOR TESTING RESIDUAL CHARACTERISTICS OF BATTERY

[76] Inventor: Wei-Jen Tsai, No. 9, Lane 194, Chung Hsiao Road, South Area, Taichung, Taiwan

[21] Appl. No.: 09/389,238

[22] Filed: Sep. 3, 1999

[51] Int. Cl.⁷ .................................................. H01M 10/44
[52] U.S. Cl. .............................................................. 320/132
[58] Field of Search ..................................... 320/132, 149, 320/135, DIG. 21; 324/426, 427, 430, 433

[56] References Cited

U.S. PATENT DOCUMENTS 5,387,871   2/1995   Tsai .

*Primary Examiner*—Edward H. Tso
*Attorney, Agent, or Firm*—Browdy and Neimark

[57] ABSTRACT

A method is used for testing residual capacity and residual discharge time of a battery. The discharge of the battery is first undertaken for period lasting five minutes before the values of the terminal voltage and the discharge current are measured. The discharge rate is then obtained by using an inverse proportion relationship between the terminal voltage and the discharge rate. The residual capacity of the battery is obtained by multiplying the discharge rate by the discharge current. The residual discharge time of the battery is obtained by dividing the residual capacity by a normally-required current.

6 Claims, 1 Drawing Sheet

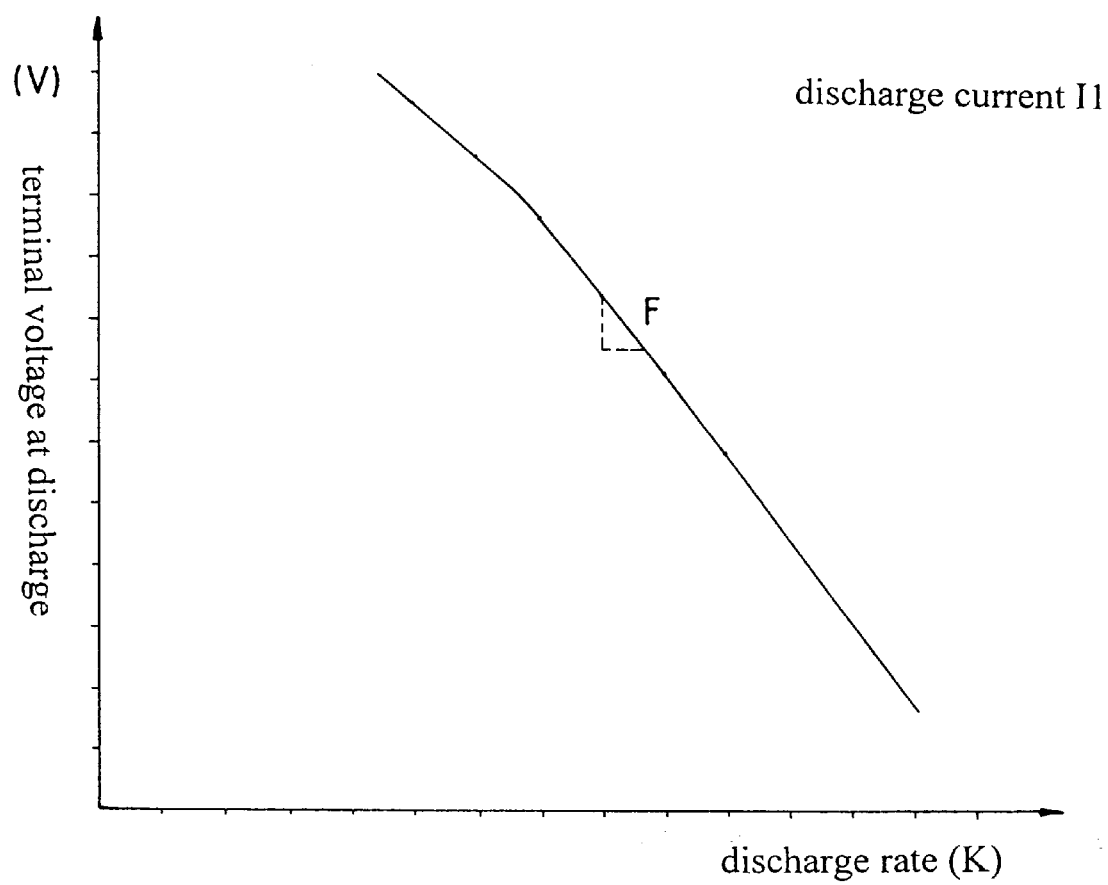
F I G. 1

6,127,807

METHOD FOR TESTING RESIDUAL CHARACTERISTICS OF BATTERY

FIELD OF THE INVENTION

The present invention relates generally to a method for testing characteristics of a battery, and more particularly to a method for testing residual characteristics of a battery.

BACKGROUND OF THE INVENTION

The computer or communication control rooms is generally provided with a standby battery set ready to be put into service on an emergency basis at such time when the outage of electric power or failure of a rectifier takes place. The standby battery set is kept ready to be put into service at any moment by being connected with the floating charge of the rectifier. The standby battery set is, in fact, a part of the power system for providing the computer or communication equipment with an uninterrupted supply of direct current. However, the battery set will not be ready for service until such time when the initial charge, the discharge test, and the recharge of the battery set are completed.

The standby battery set of the power system is vulnerable to failure due to such factors as the fall-off of the activated (effective) material, the hardening of the negative or positive plate, etc. In view of these factors, the battery capacity is gradually deteriorated, whereas the internal resistance of the battery is progressively increased. Even if the battery set contains only one or two bad batteries, the overall function of the battery set can be adversely affected in view of the fact that the battery set is made up of a plurality of batteries which are connected in series, and that the inadequate residual capacity and the excessive internal resistance of the bad batteries can bring about a reverse charge at such time when the discharge of the battery takes place. It is therefore readily apparent that the residual capacity and other characteristics of the battery set must be monitored from time to time so as to ensure that the operation of the computer or communication system is not paralyzed in the event of a power outage.

The conventional method for testing the residual capacity of a battery set involves the separation of the battery set from the computer or communication system before the battery set is connected with a dummy load, such as a resistance, for doing a discharge test. The current and the time of the discharge test are dependent on the ampere-hour capacity of the battery. Generally speaking, the discharge test lasts eight or ten hours. Take a battery (3200AH) as an example. The discharge test of the battery lasts eight hours, whereas the current is 400 A. For the capacity test of each battery set, it is necessary to do the discharge for several hours and the recharge for more than 10 hours, so as to evaluate the capacity of the battery set. In addition, the test must be manned such that the voltage, the specific gravity of the electrolyte, the temperature of each battery of the battery set must be recorded. Such work assignments are time-consuming and costly. Take a local area communication system as an example, the standby battery set consists of at least 24 batteries. It is indeed too expensive to check the residual capacity and other characteristics of each of the 24 batteries.

With a view to overcoming the deficiencies of the conventional test method described above, this inventor of the present invention discloses in the U.S. Pat. No. 5,387,871 an advanced method for testing the characteristics of a battery set. The method makes use of a multiple loop voltage tester via which the data of the voltage and the current of each battery of the battery set are recorded in a computer during the charging-discharging period of the test. Upon completion of the charging-discharging test, the internal resistances of each battery during the charging period and the discharging period are computed by the computer on the basis of the terminal voltage of each battery. The internal resistance characteristic is expressed by a curve. As a result, a battery characteristic curve of the battery set can be established for comparison. The characteristics of the each battery of the battery set can be thus judged by the interval between the curves.

The advanced method described above is defective in design in that the curves are numerous, and that the size scale must be enlarged appropriately to avoid an erroneous reading, and further that the curves do not reveal the residual capacity of any one of the batteries of the battery set, and further that it is a time-consuming task requiring 50 to 60 minutes to finish the charging and the discharging tests.

SUMMARY OF THE INVENTION

It is therefore the primary objective of the present invention to provide a method for testing the residual capacity of each battery of a battery set in such a manner that the reading and the judging of the test results are based on the data in place of the curves.

It is another objective of the present invention to provide a cost-effective and efficient method for testing the residual characteristics of each battery of a battery set.

The objectives, features and advantages of the present invention will be readily understood upon a thoughtful deliberation of the following detailed description of the present invention with reference to the accompanying drawing.

BRIEF DESCRIPTION OF THE DRAWINGS

FIG. 1 is a diagram showing the relationship between the terminal voltage and the discharge rate of the present invention under the discharge current I1.

DETAILED DESCRIPTION OF THE INVENTION

A method embodied in the present invention for testing the residual characteristics of a battery must be established at the time when the discharge of the battery takes place. The basic theory of the battery characteristics and the inference of the test data are explained hereinafter.

The internal resistance R of the battery is about directly proportional to the devaluation of the battery terminal voltage V in view of the theoretical relationship between the internal resistance and the terminal voltage being as follows:

discharge current (I) x battery internal resistance (R)=chemical potential (E) of battery-terminal voltage (V)

When the battery is in the state of floating charge, the chemical potential (E) of the battery may be regarded as a constant. In the meantime, the discharge current (I) is a specified value. The battery internal resistance (R) is thus about directly proportional to the devaluation of the terminal voltage (V).

The battery internal resistance (R) is about inversely proportional to the battery residual capacity (C). The test shows such a relationship between the internal resistance (R) and the residual capacity (C) at the time of discharge.

The devaluation of the battery terminal voltage (V) is about inversely proportional to the battery residual capacity (C).

The current is about inversely proportional to the discharge rate (K) in view of the relationship which is expressed as follows:

residual capacity (C)=discharge current (I)x discharge rate (K)

When the discharge current remains constant, the discharge rate (K) is directly proportional to the residual capacity (C). It can be therefore inferred that the discharge rate (K) is inversely proportional to the devaluation of the terminal voltage (V).

The above inferences are based on the assumed relationship between the devaluation of the terminal voltage (V) and the discharge rate (K). This is due to the fact that the terminal voltage (V) can be measured in relation to a measurable specified discharge current (I). However, the residual capacity (C) is not known. As a result, it is inferred that the devaluation of the terminal voltage (V) is in an inverse proportion to the discharge rate (K). In the discharge test conducted by this inventor of the present invention, the terminal voltage (V) was plotted against the discharge rate (K) in a coordinate, as shown in FIG. 1. The line section is wavy and double sectioned. In light of the line section separation of the small segment, it is readily apparent that the inverse relationship exists, and that an inverse proportion constant F can be derived. In fact, the same inference was arrived at under a variety of the specified discharge currents I2, I3, I4 . . . . In spite of the relationship between the terminal voltage (V) and the discharge rate (K) being wavy and multisectioned, the inversely proportional relationship between the terminal voltage and the discharge rate can be established in view of the line section separation of the small segment. In addition, various inverse proportion constants F can be obtained under various segments.

Under a specified discharge current I, the relationship between the battery terminal voltage (V) and the discharge rate (K) is expressed by an equation as follows:

$$V = \frac{F}{K}$$

Under various discharge conditions, the constant F can be derived from the experimental results, the relationship between the battery terminal voltage (V) and I/K by interpolation, or the table comparison. Thus the method of the present invention for testing the battery residual characteristics comprises the steps an follows:

(a) undertaking the battery discharge for a period lasting about 5 minutes;

(b) measuring the value of the battery terminal voltage (V) and the value of the discharge current (I);

(c) obtaining the discharge rate (K) by using the inverse proportion relationship (F) between the terminal voltage (V) and the discharge rate (K) during the discharge in the small segment;

(d) obtaining the battery residual capacity (C) by multiplying the discharge rate (K) by the measured discharge current (I); and (e) obtaining the residual discharge time by dividing the residual capacity (C) by the normally-required power current (I1), which is not necessarily equal to the measured discharge current (I).

According to the method of the present invention, the residual capacity and the residual discharge time are expressed by data in place of the curves of the conventional method. The method of the present invention is relatively cost-effective and efficient in view of the fact that the discharge test of the method of the present invention lasts no more than five minutes. In addition, the method of the present invention is capable of measuring the residual capacity and the residual discharge time of the battery with a greater precision which may be as high as 80% or even 90%. The measurement precision of the method of the present invention can be much better if the adjustments of temperature and other elements are factored into.

What is claimed is:

1. A method for testing residual capacity and residual discharge time of a battery, said method comprising the steps of:

(a) undertaking a discharge of the battery for a period;

(b) measuring the value of a battery terminal voltage and the value of a discharge current;

(c) obtaining a discharge rate by using an inverse proportion relationship between the terminal voltage and the discharge rate during the discharge in a small segment; and (d) obtaining the residual capacity of the battery by multiplying the discharge rate by the discharge current.

2. The method as defined in claim 1, wherein the discharge of the battery was undertaken for a period lasting five minutes in the step (a).

3. The method as defined in claim 1, wherein said residual discharge time of the battery is obtained by dividing said residual capacity by a normally-required current.

4. The method as defined in claim 1, wherein said inverse proportion relationship is expressed by a constant; and wherein said discharge rate is obtained by dividing said constant by said terminal voltage value.

5. The method as defined in claim 1, wherein said discharge rate is obtained by interpolation of values of said terminal voltage.

6. The method as defined in claim 1, wherein said discharge rate is obtained by table of values of said terminal voltage.

\* \* \* \* \*